United States Patent
Chou et al.

(10) Patent No.: US 8,949,507 B2
(45) Date of Patent: Feb. 3, 2015

(54) METHOD FOR PERFORMING BLOCK MANAGEMENT, AND ASSOCIATED MEMORY DEVICE AND CONTROLLER THEREOF

(75) Inventors: Po-Sheng Chou, New Taipei (TW); Ching-Chin Chang, Kaohsiung (TW); Yang-Chih Shen, Taipei (TW)

(73) Assignee: Silicon Motion Inc., Jhubei, Hsinchu County (TW)

( * ) Notice: Subject to any disclaimer, the term of this patent is extended or adjusted under 35 U.S.C. 154(b) by 441 days.

(21) Appl. No.: 13/115,962

(22) Filed: May 25, 2011

(65) Prior Publication Data

US 2012/0079168 A1 Mar. 29, 2012

(30) Foreign Application Priority Data

Sep. 27, 2010 (TW) .............................. 99132561 A

(51) Int. Cl.
*G06F 12/00* (2006.01)
*G06F 13/00* (2006.01)
*G06F 13/28* (2006.01)
*G06F 12/02* (2006.01)
*G11C 29/00* (2006.01)
*G11C 29/04* (2006.01)

(52) U.S. Cl.
CPC ............ *G06F 12/0246* (2013.01); *G11C 29/82* (2013.01); *G11C 29/883* (2013.01); *G06F 2212/7208* (2013.01); *G11C 2029/0409* (2013.01)
USPC ......................................................... 711/103

(58) Field of Classification Search
USPC ......................................................... 711/103
See application file for complete search history.

(56) References Cited

U.S. PATENT DOCUMENTS

| 7,839,684 | B2 * | 11/2010 | Kao et al. ................. 365/185.09 |
| 7,970,985 | B2 * | 6/2011 | Gonzalez et al. ............. 711/103 |
| 8,244,966 | B2 * | 8/2012 | Huang ........................ 711/103 |
| 2005/0144516 | A1 | 6/2005 | Gonzalez |
| 2009/0182932 | A1 * | 7/2009 | Tan et al. ...................... 711/103 |
| 2009/0327840 | A1 | 12/2009 | Moshayedi |
| 2010/0017650 | A1 * | 1/2010 | Chin et al. ........................ 714/6 |
| 2010/0250826 | A1 * | 9/2010 | Jeddeloh ...................... 711/103 |
| 2011/0093649 | A1 * | 4/2011 | Lee ............................... 711/103 |
| 2012/0239853 | A1 * | 9/2012 | Moshayedi ................... 711/103 |

FOREIGN PATENT DOCUMENTS

TW 200907675 2/2009

* cited by examiner

*Primary Examiner* — Michael Alsip
(74) *Attorney, Agent, or Firm* — Winston Hsu; Scott Margo

(57) ABSTRACT

A method for performing block management is provided. The method is applied to a controller of a Flash memory having multiple channels. The Flash memory includes a plurality of blocks respectively corresponding to the channels. The method includes: temporarily storing at least one index of at least one good block that is not grouped into any meta block into a spare good block table, where the good block is a block that is not determined as a bad block within the plurality of blocks; and when it is detected that a specific block corresponding to a specific channel within blocks currently grouped into meta blocks is a bad block, dynamically updating the spare good block table for use of block management. In particular, when needed, the good block is utilized for replacing a block grouped into a meta block. An associated memory device and a controller thereof are also provided.

11 Claims, 9 Drawing Sheets

|       | Ch(0) | Ch(1) | Ch(2) | Ch(3) |
|-------|-------|-------|-------|-------|
| 0     | X     | 0     | 0     | X     |
| 1     | 1     | X     | 1     | 1     |
| 2     | X     | 2     | X     | 2     |
| 3     | 3     | 3     | 3     | 3     |
| ⋮     | ⋮     | ⋮     | ⋮     | ⋮     |
| (K-3) | X     | (K-3) | (K-3) | (K-3) |
| (K-2) | X     | (K-2) | (K-2) | (K-2) |
| (K-1) | X     | (K-1) | (K-1) | (K-1) |

Damaged meta block
→ M(0)
→ M(1)
→ M(2)

FIG. 4A

|   | Ch(0) | Ch(1) | Ch(2) | Ch(3) |
|---|---|---|---|---|
| 0 | 0 | X | 0 | X |
| 1 | 1 | X | 1 | 1 |
| 2 | X | 2 | X | 2 |
| 3 | 3 | 3 | 3 | 3 |
| ⋮ | ⋮ | ⋮ | ⋮ | ⋮ |
| (K-3) | X | (K-3) | (K-3) | (K-3) |
| (K-2) | X | (K-2) | (K-2) | (K-2) |
| (K-1) | X | (K-1) | (K-1) | (K-1) |

Damaged meta block M(0)
M(1)
M(2)

| | Ch(0) | Ch(1) | Ch(2) | Ch(3) |
|---|---|---|---|---|
| M(0) | 0 | (K-3) | 0 | 1 |
| M(1) | 1 | 2 | 1 | 2 |
| M(2) | 3 | 3 | 3 | 3 |
| ⋮ | ⋮ | ⋮ | ⋮ | ⋮ |

| Ch(0) | Ch(1) | Ch(2) | Ch(3) |
|---|---|---|---|
| X | X | (K-3) | (K-3) |
| X | (K-2) | (K-2) | (K-2) |
| X | (K-1) | (K-1) | (K-1) |

FIG. 5C

METHOD FOR PERFORMING BLOCK MANAGEMENT, AND ASSOCIATED MEMORY DEVICE AND CONTROLLER THEREOF

BACKGROUND OF THE INVENTION

1. Field of the Invention

The present invention relates to access to a Flash memory having multiple channels, and more particularly, to a method for performing block management, and to an associated memory device and a controller thereof.

2. Description of the Prior Art

As technologies of Flash memories progress in recent years, many kinds of portable memory devices (e.g. memory cards respectively complying with SD/MMC, CF, MS, and XD standards) or solid state drives (SSDs) equipped with Flash memories are widely implemented in various applications. Therefore, the control of access to Flash memories in these memory devices has become an important issue.

Taking NAND Flash memories as an example, they can mainly be divided into two types, i.e. Single Level Cell (SLC) Flash memories and Multiple Level Cell (MLC) Flash memories. Each transistor that is considered a memory cell in SLC Flash memories only has two charge levels that respectively represent a logical value 0 and a logical value 1. In addition, the storage capability of each transistor that is considered a memory cell in MLC Flash memories can be fully utilized. More specifically, the voltage for driving memory cells in the MLC Flash memories is typically higher than that in the SLC Flash memories, and different voltage levels can be applied to the memory cells in the MLC Flash memories in order to record information of at least two bits (e.g. binary values 00, 01, 11, or 10) in a transistor that is considered a memory cell. Theoretically, the storage density of the MLC Flash memories may reach twice the storage density of the SLC Flash memories, which is considered good news for NAND Flash memory manufacturers who encountered a bottleneck of NAND Flash technologies.

As MLC Flash memories are cheaper than SLC Flash memories, and are capable of providing higher capacity than SLC Flash memories while the space is limited, MLC Flash memories have been a main stream for implementation of most portable memory devices on the market. However, various problems of the MLC Flash memories have arisen due to their unstable characteristics. In order to ensure that the access control of a memory device over the Flash memory therein can comply with related standards, the controller of the Flash memory should have some handling mechanisms in order to properly handle its data access operations.

According to the related art, the memory device having the aforementioned handling mechanisms may still suffer from some deficiencies. For example, the handling mechanisms of the related art cannot ensure that the storage space within a Flash memory having multiple channels can be properly utilized. More particularly, some blocks might never be utilized by the end user from beginning to end. Therefore, a novel method is required for performing block management in order to properly utilize the storage space within the Flash memory.

SUMMARY OF THE INVENTION

It is therefore an objective of the claimed invention to provide a method for performing block management, and to provide an associated memory device and a controller thereof, in order to solve the above-mentioned problem.

It is another objective of the claimed invention to provide a method for performing block management, and to provide an associated memory device and a controller thereof, in order to properly utilize the storage space within the Flash memory.

According to a preferred embodiment of the claimed invention, a method for performing block management is provided. The method is applied to a controller of a Flash memory having multiple channels, wherein the Flash memory comprises a plurality of blocks respectively corresponding to the channels. The method comprises: temporarily storing at least one index of at least one good block that is not grouped into any meta block into a spare good block table, where the good block is a block that is not determined as a bad block within the plurality of blocks; and when it is detected that a specific block corresponding to a specific channel within blocks currently grouped into meta blocks is a bad block, dynamically updating the spare good block table for use of block management.

While the method mentioned above is disclosed, an associated memory device is further provided. The memory device comprises: a Flash memory having multiple channels, wherein the Flash memory comprises a plurality of blocks respectively corresponding to the channels; and a controller arranged to access the Flash memory and manage the plurality of blocks. In addition, the controller temporarily stores at least one index of at least one good block that is not grouped into any meta block into a spare good block table, wherein the good block is a block that is not determined as a bad block within the plurality of blocks. Additionally, when it is detected that a specific block corresponding to a specific channel within blocks currently grouped into meta blocks is a bad block, the controller dynamically updates the spare good block table for use of block management.

While the method mentioned above is disclosed, a controller of a memory device is further provided. The controller is utilized for accessing a Flash memory having multiple channels, wherein the Flash memory comprises a plurality of blocks respectively corresponding to the channels. The controller comprises: a read only memory (ROM) arranged to store a program code; and a microprocessor arranged to execute the program code to control the access to the Flash memory and manage the plurality of blocks. In addition, the controller that executes the program code by utilizing the microprocessor temporarily stores at least one index of at least one good block that is not grouped into any meta block into a spare good block table, where the good block is a block that is not determined as a bad block within the plurality of blocks. Additionally, when it is detected that a specific block corresponding to a specific channel within blocks currently grouped into meta blocks is a bad block, the controller that executes the program code by utilizing the microprocessor dynamically updates the spare good block table for use of block management.

According to a preferred embodiment of the claimed invention, a method for performing block management is provided. The method is applied to a controller of a Flash memory having multiple channels, wherein the Flash memory comprises a plurality of blocks respectively corresponding to the channels, and erasing a single block within the blocks of the Flash memory is achievable. The method comprises: establishing a meta block, wherein the meta block comprises blocks respectively belonging to different channels, and the controller erases the Flash memory with the meta block being a minimum erasure unit; and according to damage statuses of the blocks within the meta block, updating block composition of the meta block or updating a damage status of the meta block. In particular, the step of updating the block composition of the meta block further comprises: when it is detected that a block belonging to a first channel within the meta block is determined as a bad block, replacing the bad block with a good block belonging to the first channel.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 4A-4C illustrate some implementation details of the method shown in FIG. 2 according to another embodiment of the present invention.

FIGS. 5A-5C illustrate some implementation details of the method shown in FIG. 2 according to another embodiment of the present invention.

DETAILED DESCRIPTION

Figure 1A:
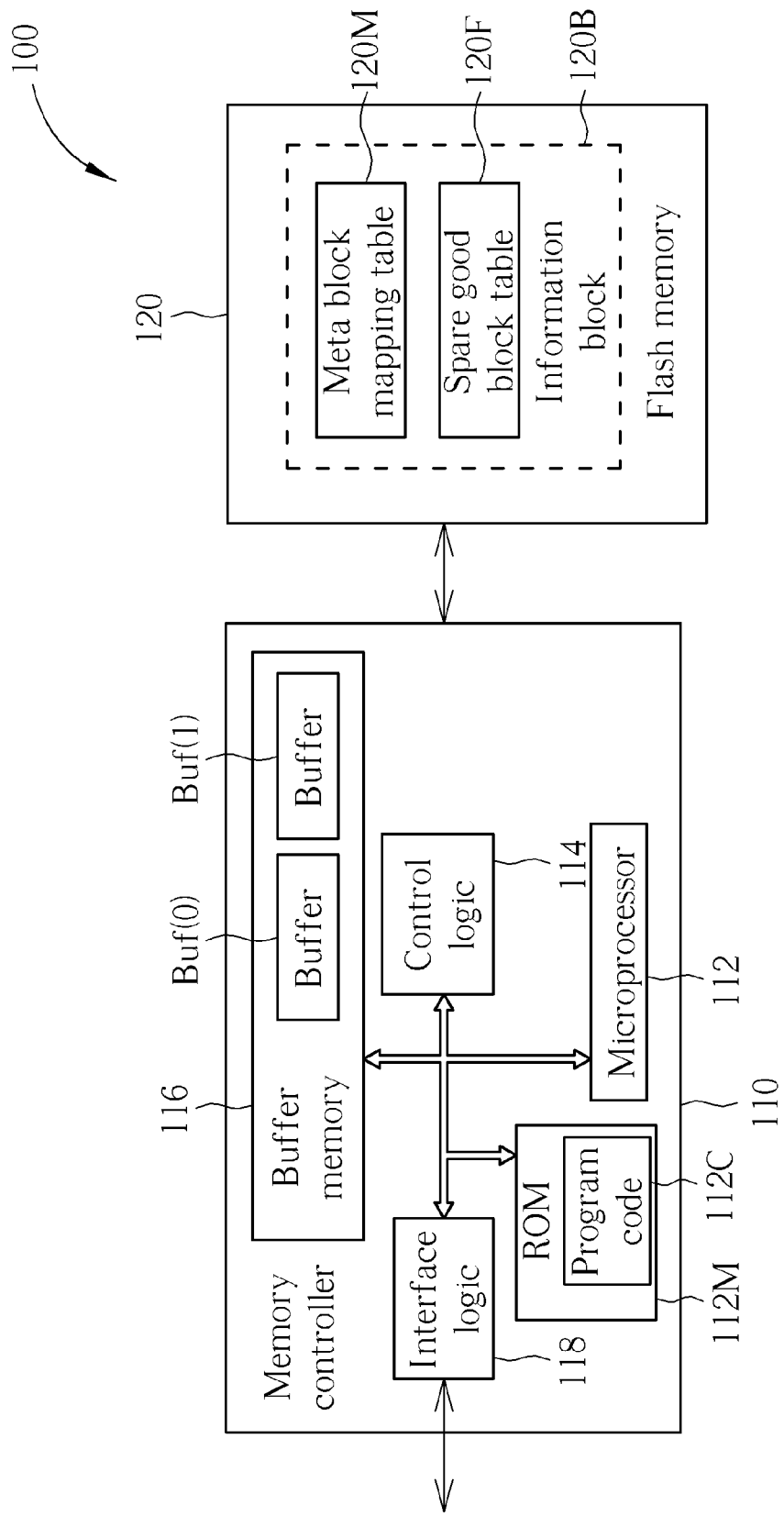
FIG. 1A is a diagram of a memory device according to a first embodiment of the present invention.

Please refer to FIG. 1A, which illustrates a diagram of a memory device 100 according to a first embodiment of the present invention. In particular, the memory device 100 of this embodiment can be a portable memory device, examples of which may include, but not limited to, memory cards complying with SD/MMC, CF, MS, or XD standards. Here, the portable memory device is taken as an example of the memory device 100 in this embodiment. This is for illustrative purposes only, and is not meant to be a limitation of the present invention. According to a variation of this embodiment, the memory device 100 can be a solid state drive (SSD). Referring to FIG. 1A, the memory device 100 comprises a Flash memory 120 comprising at least one information block 120B, and further comprises a controller arranged to access the Flash memory 120, where the aforementioned controller of this embodiment is a memory controller 110. According to this embodiment, the memory controller 110 comprises a microprocessor 112, a read only memory (ROM) 112M, a control logic 114, at least one buffer memory 116, and an interface logic 118. In addition, the ROM 112M is arranged to store a program code 112C, and the microprocessor 112 is arranged to execute the program code 112C to control the access to the Flash memory 120. Please note that the program code 112C can be stored in the buffer memory 116 or any of various kinds of memories according to variations of this embodiment.

As shown in FIG. 1A, the aforementioned at least one information block 120B is utilized for storing information regarding block management, and more particularly, a meta block mapping table 120M and a spare good block table 120F. According to this embodiment, the buffer memory 116 comprises buffers Buf(0) and Buf(1). For example, the buffers Buf(0) and Buf(1) can be a plurality of buffering regions within the buffer memory 116, respectively. In another example, the aforementioned at least one buffer memory 116 comprises a plurality of buffer memories, which can be utilized for implementing the buffers Buf(0) and Buf(1), respectively. In this embodiment, the aforementioned controller (e.g. the memory controller 110 that executes the program code 112C by utilizing the microprocessor 112) can store a previous version of the spare good block table 120F into the Flash memory 120, and store a copy version of the spare good block table 120F into the buffer Buf(0), for use of dynamically updating the spare good block table 120F. In addition, the controller stores the latest version of the spare good block table 120F within the buffer Buf(0) into the Flash memory 120, in order to replace the previous version of the spare good block table 120F. Similarly, the controller can store a previous version of the meta block mapping table 120M into the Flash memory 120, and store a copy version of the meta block mapping table 120M into the buffer Buf(1), for use of dynamically updating the meta block mapping table 120M. In addition, the controller stores the latest version of the meta block mapping table 120M within the buffer Buf(1) into the Flash memory 120, in order to replace the previous version of the meta block mapping table 120M.

Figure 1B:
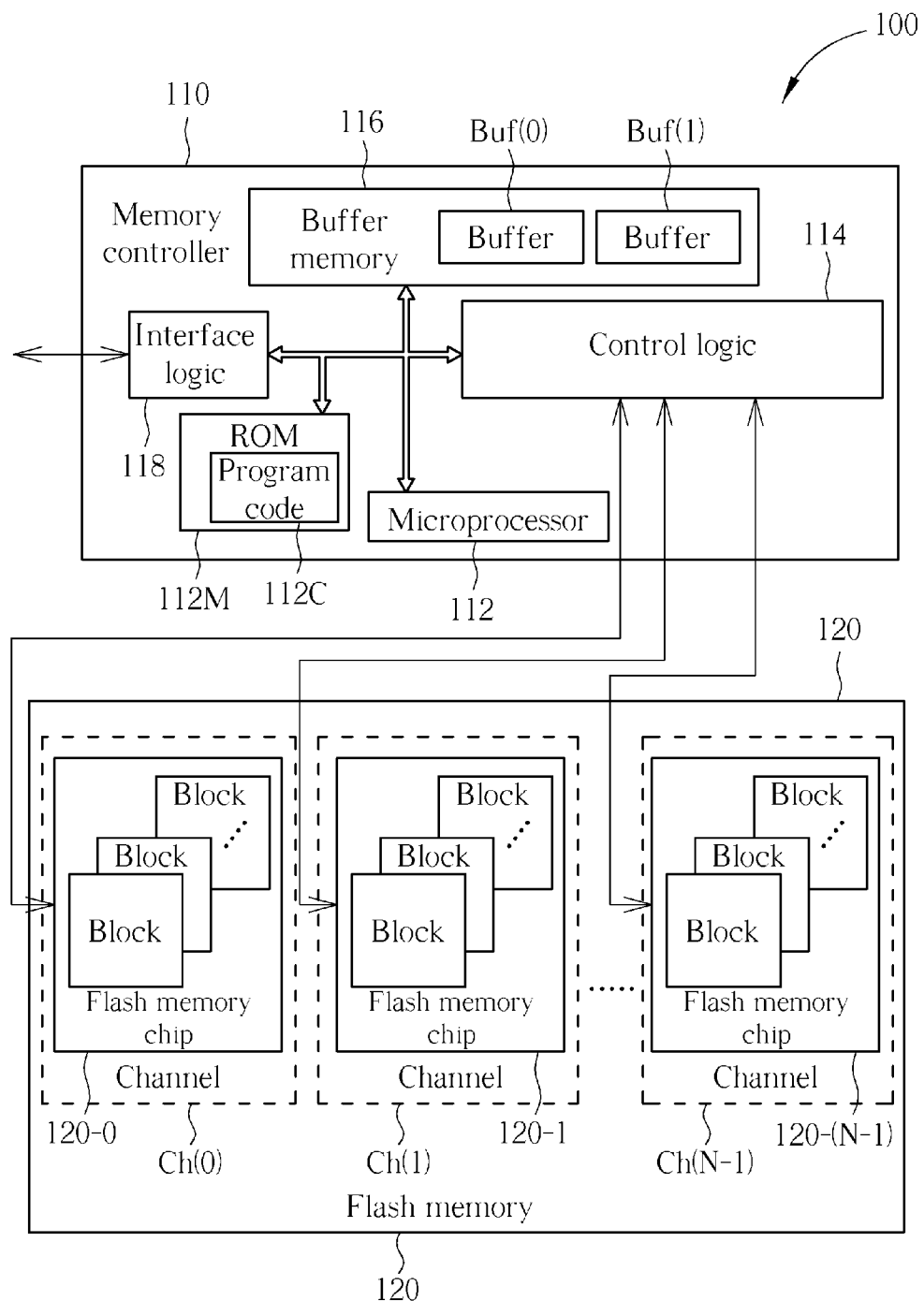
FIG. 1B illustrates some implementation details of the memory device shown in FIG. 1A according to an embodiment of the present invention.

FIG. 1B illustrates some implementation details of the memory device 100 shown in FIG. 1A according to an embodiment of the present invention. As shown in FIG. 1B, the aforementioned Flash memory 120 comprises a plurality of Flash memory chips such as the Flash memory chips 120-0, 120-1, . . . , and 120-(N−1), where the Flash memory 120 has multiple channels such as the channels Ch(0), Ch(1), . . . , and Ch(N−1), and the Flash memory chips such as the Flash memory chips 120-0, 120-1, . . . , and 120-(N−1) respectively belong to the channels. Typically, in addition to the aforementioned at least one information block 120B, the Flash memory 120 further comprises a plurality of blocks respectively corresponding to the channels, and when the controller (e.g. the memory controller 110 that executes the program code 112C by utilizing the microprocessor 112) performs data erasure operations on the Flash memory chips, the minimum erasure unit can be a block. In this embodiment, the controller performs data erasure operations in units of meta blocks, where a meta block may comprise some blocks respectively belonging to the channels, and the controller can erase the Flash memory 120 with the meta block being a minimum erasure unit. In addition, a block can be utilized for recording a specific amount of pages, and when the controller performs data writing operations on any of the Flash memory chips, the minimum writing unit can be a page. Additionally, the information block 120B can be installed/positioned at a specific location of a certain channel, such as the first block of the channel Ch(0), or can be distributed over the respective channels in a situation where the aforementioned at least one information block 120B comprises a plurality of information blocks (not shown in FIG. 1B).

In practice, the memory controller 110 that executes the program code 112C by utilizing the microprocessor 112 is capable of performing various control operations by utilizing the internal components within the memory controller 110. For example, the memory controller −110 utilizes the control logic 114 to control access to each Flash memory chip (e.g. operations of accessing at least one block or at least one page), utilizes the buffer memory 116 to perform buffering operations for the memory controller 110, and utilizes the interface logic 118 to communicate with a host device.

Figure 2:
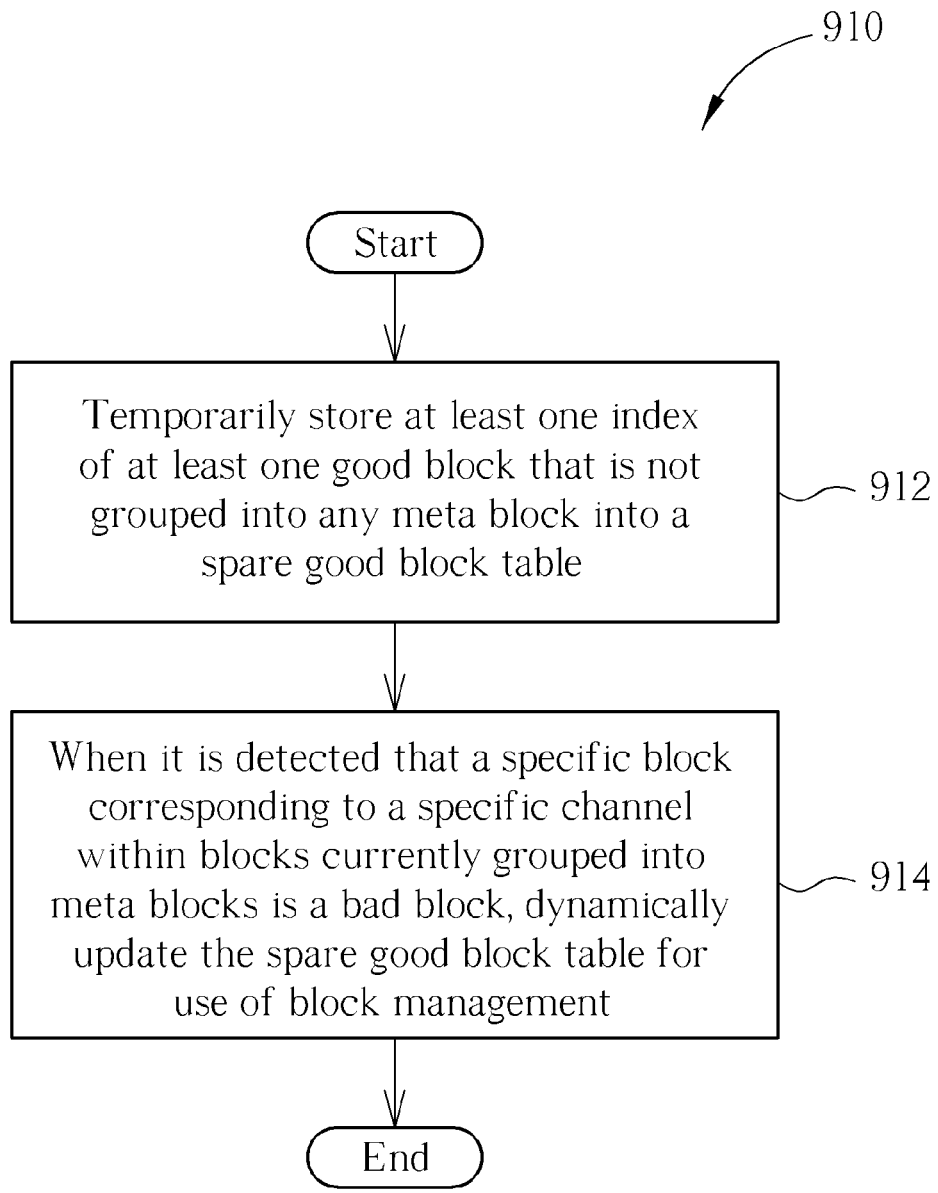
FIG. 2 is a flowchart of a method for performing block management according to an embodiment of the present invention.

According to this embodiment, in addition to accessing the Flash memory 120, the memory controller 110 is capable of properly managing the plurality of blocks mentioned above. More specifically, the controller can dynamically group the plurality of blocks mentioned above into a plurality of meta blocks such as the meta blocks M(0), M(1), M(2), ..., etc., and dynamically update the meta block mapping table 120M, for reference of accessing data. In addition, the controller can dynamically update the spare good block table 120F, for use of block management. Referring to FIG. 2, related details are further described as follows.

FIG. 2 is a flowchart of a method 910 for performing block management according to an embodiment of the present invention. The method can be applied to the memory device 100 in any of the respective embodiments shown in FIGS. 1A-1B (and associated variations), and more particularly, the controller of the Flash memory 120 having multiple channels, such as the aforementioned controller (e.g. the memory controller 110 that executes the program code 112C by utilizing the microprocessor 112). The method is described as follows.

In Step 912, the controller temporarily stores at least one index of at least one good block that is not grouped into any meta block into a spare good block table such as the aforementioned spare good block table 120F, where the good block is a block that is not determined as a bad block within the plurality of blocks. More particularly, the aforementioned at least one index corresponds to at least one physical address. This is for illustrative purposes only, and is not meant to be a limitation of the present invention. According to different variations of this embodiment, the aforementioned at least one index represents at least one physical address, and/or the aforementioned at least one index corresponds to at least one physical address.

In Step 914, when it is detected that a specific block corresponding to a specific channel within blocks currently grouped into meta blocks is a bad block, the controller dynamically updates the spare good block table 120F for use of block management. For example, when needed, the good block can be utilized for replacing a block grouped into a meta block. More particularly, this meta block is a damaged meta block comprising at least one bad block. In response to this replacing operation, the controller dynamically updates the spare good block table 120F. In another example, the aforementioned controller can cancel a grouping relationship corresponding to a damaged meta block, rather then performing any replacing operation. In response to the operation of canceling the grouping relationship, the controller dynamically updates the spare good block table 120F.

Figure 3A:
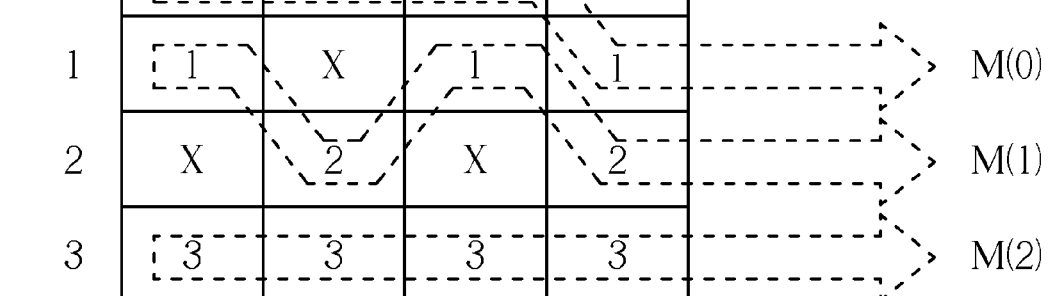
FIGS. 3A-3C illustrate some implementation details of the method shown in FIG. 2 according to an embodiment of the present invention.
Figure 3B:
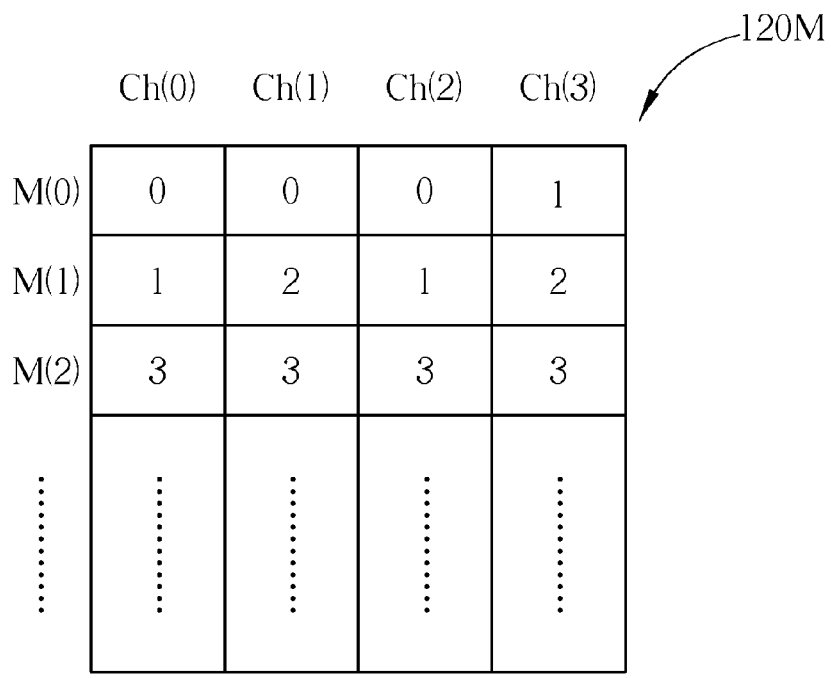
Figure 3C:
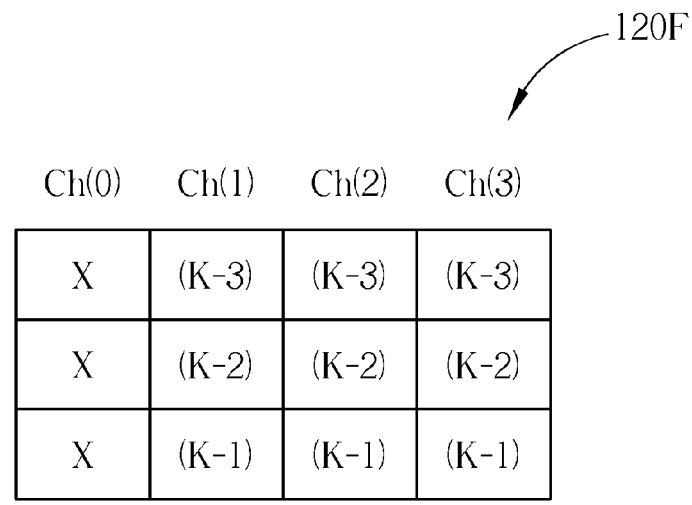

FIGS. 3A-3C illustrate some implementation details of the method 910 shown in FIG. 2 according to an embodiment of the present invention. As shown in FIG. 3A, in a situation where the number N of the channels Ch(0), Ch(1), ..., and Ch(N−1) is equal to four, the respective blocks within the respective channels Ch(0), Ch(1), Ch(2), and Ch(3) can be respectively represented by the indexes 0, 1, 2, 3, ..., (K−3), (K−2), and (K−1), where the notation "X" shown in FIG. 3A can be utilized for representing bad blocks. The controller can dynamically group the good blocks represented by these indexes into the meta blocks M(0), M(1), M(2), ..., etc., and discard these bad blocks without using them. Please note that, the controller can establish the meta block mapping table 120M and the spare good block table 120F when the operation of initializing the Flash memory 120 is performed, and can also dynamically update the meta block mapping table 120M and the spare good block table 120F in response to the trigger of a specific event at any time after the operation of initializing the Flash memory 120 is performed.

As shown in FIG. 3B, in response to the grouping operation shown in FIG. 3A, the controller temporarily stores the indexes of the blocks that are respectively grouped into meta blocks into the meta block mapping table 120M correspondingly. For example, the meta block M(0) comprises the blocks $B_0(0)$, $B_1(0)$, $B_2(0)$, and $B_3(1)$ respectively corresponding to the channels Ch(0), Ch(1), Ch(2), and Ch(3), so the controller temporarily stores the indexes {0, 0, 0, 1} of the blocks $B_0(0)$, $B_1(0)$, $B_2(0)$, and $B_3(1)$ that are grouped into the same meta block M(0) into the respective fields corresponding to the meta block M(0) within the meta block mapping table 120M. In another example, the meta block M(1) comprises the blocks $B_0(1)$, $B_1(2)$, $B_2(1)$, and $B_3(2)$ respectively corresponding to the channels Ch(0), Ch(1), Ch(2), and Ch(3), so the controller temporarily stores the indexes {1, 2, 1, 2} of the blocks $B_0(1)$, $B_1(2)$, $B_2(1)$, and $B_3(2)$ that are grouped into the same meta block M(1) into the respective fields corresponding to the meta block M(1) within the meta block mapping table 120M. In another example, the meta block M(2) comprises the blocks $B_0(3)$, $B_1(3)$, $B_2(3)$, and $B_3(3)$ respectively corresponding to the channels Ch(0), Ch(1), Ch(2), and Ch(3), so the controller temporarily stores the indexes {3, 3, 3, 3} of the blocks $B_0(3)$, $B_1(3)$, $B_2(3)$, and $B_3(3)$ that are grouped into the same meta block M(2) into the respective fields corresponding to the meta block M(2) within the meta block mapping table 120M.

As shown in FIG. 3C, with regard to the channels Ch(1), Ch(2), and Ch(3), the controller temporarily stores the indexes of the good blocks $B_1(K-3)$, $B_1(K-2)$, $B_1(K-1)$, $B_2(K-3)$, $B_2(K-2)$, $B_2(K-1)$, $B_3(K-3)$, $B_3(K-2)$, and $B_3(K-1)$ that are not grouped into any meta block into the spare good block table 120F, respectively. Please note that the notation "X" shown in FIG. 3C can be utilized for representing bad blocks. This is for illustrative purposes only, and is not meant to be a limitation of the present invention. According to some variations of this embodiment, the notation "X" within the spare good block table 120F may represent invalid records in an update operation at a certain time. For example, the field labeled with the notation "X" may represent a field that is recorded with nothing. In another example, the field labeled with the notation "X" may represent a field that is recorded with an invalid value. According to some variations of this embodiment, the notation "X" within the spare good block table 120F can be utilized for representing bad blocks and/or invalid records in an update operation at a certain time. In practice, the controller can record a negative value or a value falling outside a predetermined index range (e.g. the interval [0, (K−1)]) in any field labeled with the notation "X" within the spare good block table 120F, or can record nothing for the notation "X" illustrated on the spare good block table 120F shown in FIG. 3C, without utilizing any field (or physical memory).

Figure 4A:
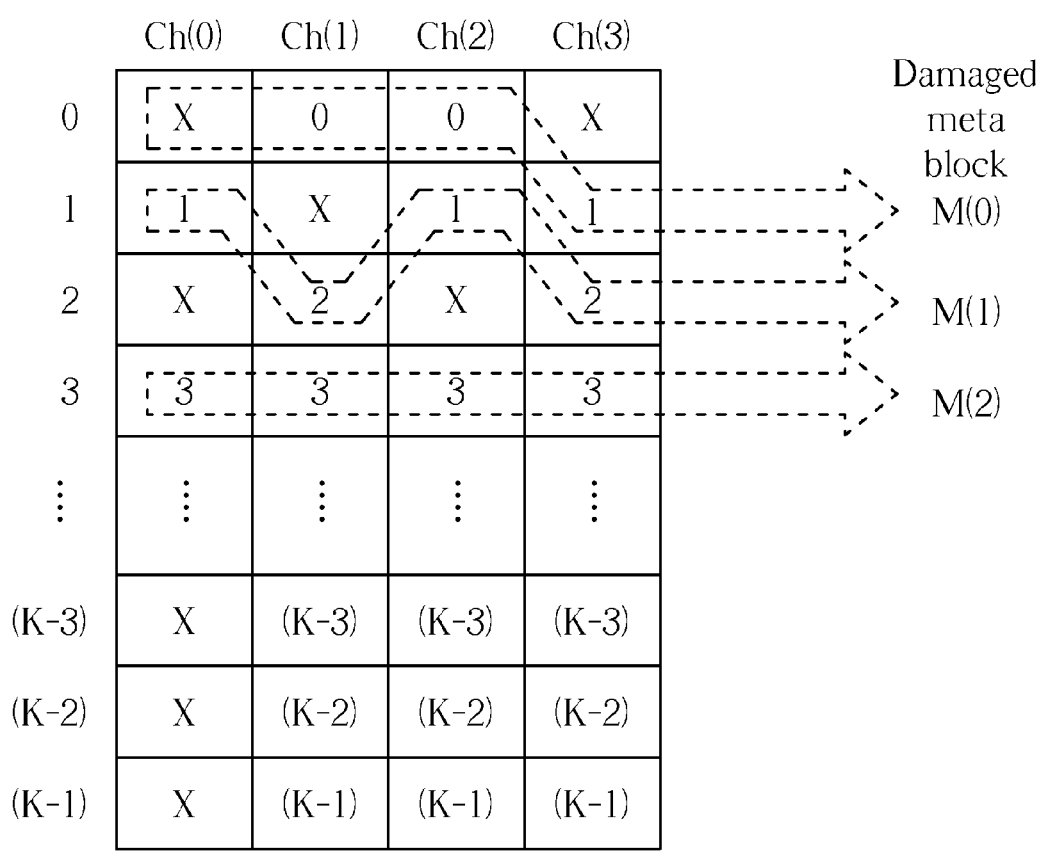
Figure 4B:
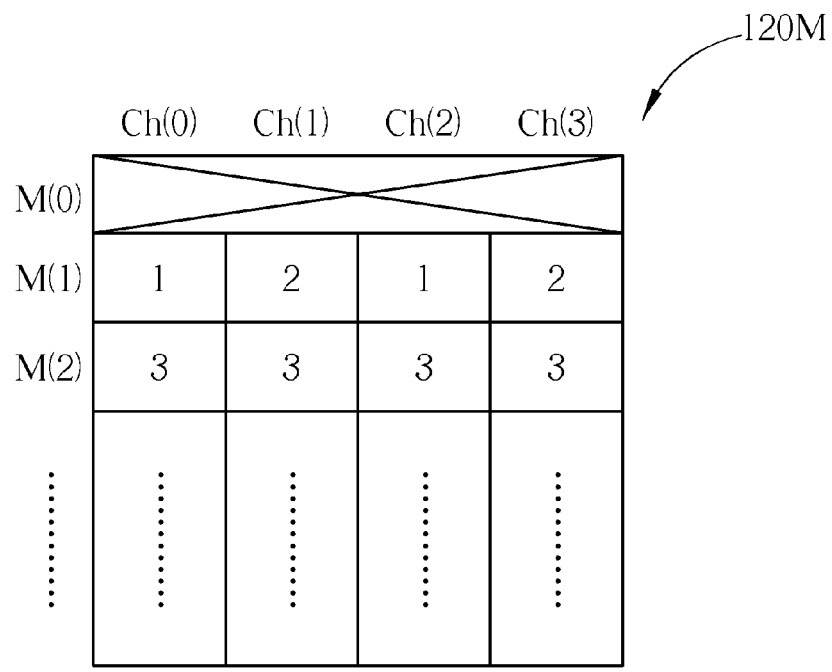
Figure 4C:
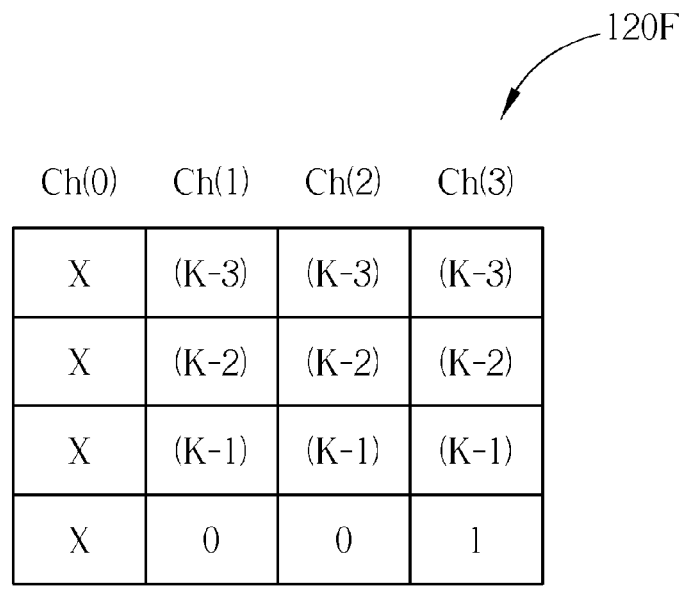

FIGS. 4A-4C illustrate some implementation details of the method 910 shown in FIG. 2 according to another embodiment of the present invention, where this embodiment is a variation of the embodiment shown in FIGS. 3A-3C. According to this embodiment, when it is detected that the specific block corresponding to the specific channel is a bad block, the controller can temporarily store at least one index of at least one other block within a meta block to which the specific block belongs into the spare good block table 120F.

For example, "the specific block corresponding to the specific channel" under consideration in this embodiment can be the block $B_0(0)$ corresponding to the channel Ch(0). In a situation where the block $B_0(0)$ becomes a bad block after a lot of writing and erasing operations thereof are performed, which means the meta block M(0) of the embodiment shown in FIGS. 3A-3C becomes a damaged meta block, the controller can discard/give up the bad block $B_0(0)$ and the good blocks $B_1(0)$, $B_2(0)$, and $B_3(1)$ without using them, where the good blocks $B_1(0)$, $B_2(0)$, and $B_3(1)$ are temporarily given up at this moment, rather than being discarded permanently. For example, the controller can adjust at least one pointer or alter the information corresponding to the damaged meta block M(0) within the meta block mapping table 120M, causing the damaged meta block M(0) to be not used, where the controller has no need to change the information corresponding to other meta blocks such as the meta blocks M(1), M(2), ..., etc. within the meta block mapping table 120M shown in FIG. 4B. In addition, the controller temporarily stores the indexes 0, 0, and 1 of the other blocks $B_1(0)$, $B_2(0)$, and $B_3(1)$ within the meta block M(0) to which the bad block $B_0(0)$ belongs into the respective fields within the spare good block table 120F, where the controller updates the spare good block table 120F, as shown in FIG. 4C. Please note that, after the latest update of the spare good block table 120F, the notation "X" in the bottommost row thereof (i.e. the row having the records {X, 0, 0, 1}) represents an invalid record in the update operation at this time. Similar descriptions are not repeated in detail for this embodiment. Please note that, in an embodiment, the controller can record no bad block within the spare good block table 120F, and merely record spare good blocks within the spare good block table 120F. More particularly, the controller can record bad blocks within a bad block table.

Figure 5A:
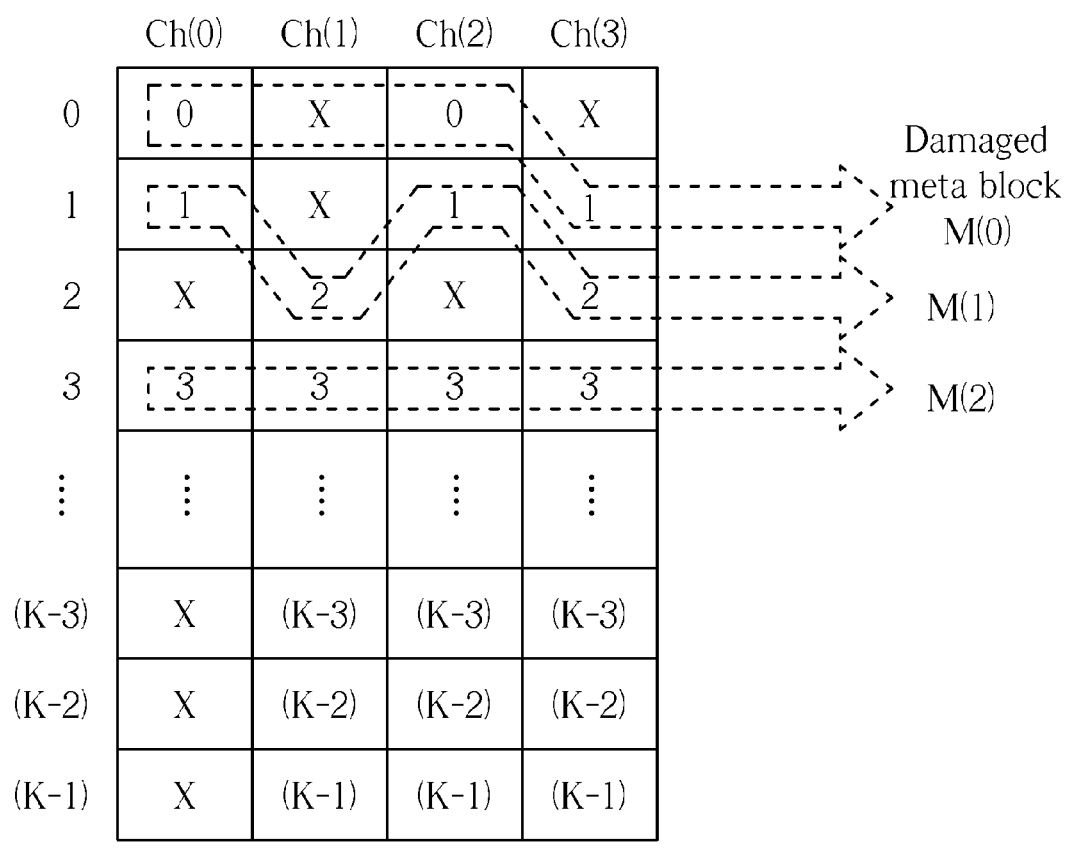

FIGS. 5A-5C illustrate some implementation details of the method 910 shown in FIG. 2 according to another embodiment of the present invention, where this embodiment is a variation of the embodiment shown in FIGS. 3A-3C. According to this embodiment, when it is detected that the specific block corresponding to the specific channel is a bad block and the spare good block table 120F indicates that a good block corresponding to the specific channel exists, the controller can dynamically replace the specific block (i.e. the bad block that is detected) with the good block corresponding to the specific channel. More particularly, when dynamically replacing the specific block with the good block corresponding to the specific channel, the controller can remove the index of the good block corresponding to the specific channel from the spare good block table 120F.

Please note that this embodiment can be regarded as a variation of the embodiment shown in FIGS. 4A-4C. However, referring to the information corresponding to the damaged meta block M(0) within FIG. 5A, "the specific block corresponding to the specific channel" under consideration (i.e. the bad block that is detected) in this embodiment is the block $B_1(0)$ corresponding to the channel Ch(1), rather than the block $B_0(0)$ in the embodiment shown in FIGS. 4A-4C. For example, when it is detected that the block $B_1(0)$ corresponding to the channel Ch(1) is (or becomes) a bad block and the spare good block table 120F indicates that there exists a good block corresponding to the channel Ch(1), such as the block $B_1(K-3)$, the controller can dynamically replace the block $B_1(0)$ within the meta block M(0) with the good block $B_1(K-3)$ corresponding to the channel Ch(1), where the controller updates the field corresponding to the channel Ch(1) and the meta block M(0) within the meta block mapping table 120M with the index (K−3) of the good block $B_1(K-3)$, as shown in FIG. 5B. More particularly, when dynamically replacing the block $B_1(0)$ with the good block $B_1(K-3)$ corresponding to the channel Ch(1), the controller can remove the index (K—3) of the good block $B_1(K-3)$ corresponding to the channel Ch(1) from the spare good block table 120F. In practice, the controller can fill in the field corresponding to the channel Ch(1) within the uppermost row (i.e. the row having the records {X, X, (K−3), (K−3)}) of the spare good block table 120F shown in FIG. 5C with the information representing an invalid record, such as a negative value or a value falling outside the predetermined index range (e.g. the interval [0, (K−1)]). Thus, this field of this embodiment can be labeled with the notation "X". Similar descriptions are not repeated in detail for this embodiment.

It is an advantage of the present invention that the block management implemented according to the present invention can properly utilize the aforementioned storage space within the Flash memory, and the related art problem of wasting the storage space of the Flash memory is no longer an issue. In contrast to the related art, in a situation where the chip area and the associated costs are not greatly increased, the present invention can achieve the goal of giving consideration to both operation performance and system resource management.

Those skilled in the art will readily observe that numerous modifications and alterations of the device and method may be made while retaining the teachings of the invention.

What is claimed is:

1. A method for performing block management, the method being applied to a controller of a Flash memory having multiple channels, the Flash memory comprising a plurality of blocks respectively corresponding to the channels, the method comprising:
    temporarily storing at least one index of at least one good block that is not grouped into any meta block into a spare good block table, wherein the good block is a block that is not determined as a bad block within the plurality of blocks;
    when it is detected that a specific block corresponding to a specific channel within blocks currently grouped into meta blocks is a bad block, dynamically updating the spare good block table for use of block management;
    when it is detected that the specific block corresponding to the specific channel is a bad block and the spare good block table indicates that a good block corresponding to the specific channel exists, dynamically replacing the specific block with the good block corresponding to the specific channel;
    when dynamically replacing the specific block with the good block corresponding to the specific channel, replacing an index, stored in the spare good block table, of the good block corresponding to the specific channel by an invalid record;
    storing a previous version of the spare good block table into the Flash memory, and storing a copy version of the spare good block table into a first buffer of the controller, for use of dynamically updating the spare good block table;
    storing a previous version of a meta block mapping table into the Flash memory, and storing a copy version of the meta block mapping table into a second buffer of the controller;
    storing a latest version of the spare good block table within the first buffer and a latest version of the meta block mapping table within the second buffer into the Flash memory, in order to replace the previous version of the spare good block table and the previous version of the meta block mapping table;
    wherein each of the channels corresponds to a Flash memory chip, and each of blocks comprised in the meta block is corresponding to different Flash memory chip.

2. The method of claim 1, wherein the step of dynamically updating the spare good block table for use of block management further comprises:
    when it is detected that the specific block corresponding to the specific channel is a bad block, temporarily storing at least one index of at least one other block within a meta block to which the specific block belongs into the spare good block table.

3. The method of claim 1, wherein the at least one index represents at least one physical address, and/or the at least one index corresponds to at least one physical address.

4. A memory device, comprising:
- a Flash memory having multiple channels, wherein the Flash memory comprises a plurality of blocks respectively corresponding to the channels; and each of the channels corresponds to a Flash memory chip of the Flash memory; and
- a controller arranged to access the Flash memory and manage the plurality of blocks, wherein the controller temporarily stores at least one index of at least one good block that is not grouped into any meta block into a spare good block table, wherein the good block is a block that is not determined as a bad block within the plurality of blocks;
- wherein when it is detected that a specific block corresponding to a specific channel within blocks currently grouped into meta blocks is a bad block, the controller dynamically updates the spare good block table for use of block management; when it is detected that the specific block corresponding to the specific channel is a bad block and the spare good block table indicates that a good block corresponding to the specific channel exists the controller dynamically replaces the specific block with the good block corresponding to the specific channel; when dynamically replacing the specific block with the good block corresponding to the specific channel, the controller replaces an index, stored in the spare good block table, of the good block corresponding to the specific channel by an invalid record;
- wherein the controller stores a previous version of the spare good block table into the Flash memory, and stores a copy version of the spare good block table into a first buffer of the controller, for use of dynamically updating the spare good block table; the controller stores a previous version of a meta block mapping table into the Flash memory, and stores a copy version of the meta block mapping table into a second buffer of the controller; and the controller stores a latest version of the spare good block table within the first buffer and a latest version of the meta block mapping table within the second buffer into the Flash memory, in order to replace the previous version of the spare good block table and the previous version of the meta block mapping table;
- wherein each of blocks comprised in the meta block is corresponding to different Flash memory chip.

5. The memory device of claim 4, wherein when it is detected that the specific block corresponding to the specific channel is a bad block, the controller temporarily stores at least one index of at least one other block within a meta block to which the specific block belongs into the spare good block table.

6. The memory device of claim 4, wherein the at least one index represents at least one physical address, and/or the at least one index corresponds to at least one physical address.

7. A controller of a memory device, the controller being utilized for accessing a Flash memory having multiple channels, each of the channels corresponds to a Flash memory chip of the Flash memory, the Flash memory comprising a plurality of blocks respectively corresponding to the channels, the controller comprising:
- a read only memory (ROM) arranged to store a program code; and
- a microprocessor arranged to execute the program code to control the access to the Flash memory and manage the plurality of blocks, wherein the controller that executes the program code by utilizing the microprocessor temporarily stores at least one index of at least one good block that is not grouped into any meta block into a spare good block table, and the good block is a block that is not determined as a bad block within the plurality of blocks;
- wherein when it is detected that a specific block corresponding to a specific channel within blocks currently grouped into meta blocks is a bad block, the controller that executes the program code by utilizing the microprocessor dynamically updates the spare good block table for use of block management; when it is detected that the specific block corresponding to the specific channel is a bad block and the spare good block table indicates that a good block corresponding to the specific channel exists, the controller that executes the program code by utilizing the microprocessor dynamically replaces the specific block with the good block corresponding to the specific channel; when dynamically replacing the specific block with the good block corresponding to the specific channel, the controller that executes the program code by utilizing the microprocessor replaces an index, stored in the spare good block table, of the good block corresponding to the specific channel by an invalid record;
- wherein the controller that executes the program code by utilizing the microprocessor stores a previous version of the spare good block table into the Flash memory, and stores a copy version of the spare good block table into a first buffer of the controller, for use of dynamically updating the spare good block table; the controller stores a previous version of a meta block mapping table into the Flash memory, and stores a copy version of the meta block mapping table into a second buffer of the controller; and the controller stores a latest version of the spare good block table within the first buffer and a latest version of the meta block mapping table within the second buffer into the Flash memory, in order to replace the previous version of the spare good block table and the previous version of the meta block mapping table;
- wherein each of blocks comprised in the meta block is corresponding to different Flash memory chip.

8. The controller of claim 7, wherein when it is detected that the specific block corresponding to the specific channel is a bad block, the controller that executes the program code by utilizing the microprocessor temporarily stores at least one index of at least one other block within a meta block to which the specific block belongs into the spare good block table.

9. The method of claim 1, further comprising:
- establishing the spare good block table when an operation of initializing the Flash memory is performed.

10. The memory device of claim 4, wherein the controller establishes the spare good block table when an operation of initializing the Flash memory is performed.

11. The controller of claim 7, wherein the controller that executes the program code by utilizing the microprocessor to establish the spare good block table when an operation of initializing the Flash memory is performed.

* * * * *